(12) United States Patent
Chan et al.

(10) Patent No.: US 12,150,393 B2
(45) Date of Patent: Nov. 19, 2024

(54) HEATER FOR PHASE CHANGE MATERIAL MEMORY CELL

(71) Applicant: INTERNATIONAL BUSINESS MACHINES CORPORATION, Armonk, NY (US)

(72) Inventors: Victor W. C. Chan, Guilderland, NY (US); Jin Ping Han, Yorktown Heights, NY (US); Samuel Sung Shik Choi, Ballston Lake, NY (US); Injo Ok, Loudonville, NY (US)

(73) Assignee: International Business Machines Corporation, Armonk, NY (US)

( * ) Notice: Subject to any disclaimer, the term of this patent is extended or adjusted under 35 U.S.C. 154(b) by 221 days.

(21) Appl. No.: 17/936,982

(22) Filed: Sep. 30, 2022

(65) Prior Publication Data
US 2024/0114807 A1   Apr. 4, 2024

(51) Int. Cl.
*H10N 70/20* (2023.01)
*H10B 63/00* (2023.01)
*H10N 70/00* (2023.01)

(52) U.S. Cl.
CPC ........... *H10N 70/231* (2023.02); *H10B 63/30* (2023.02); *H10N 70/021* (2023.02); *H10N 70/063* (2023.02); *H10N 70/066* (2023.02); *H10N 70/068* (2023.02); *H10N 70/8613* (2023.02); *H10N 70/883* (2023.02)

(58) Field of Classification Search
CPC .. H10N 70/231; H10N 70/021; H10N 70/063; H10N 70/066; H10N 70/068; H10N 70/8613; H10N 70/883; H10N 70/061; H10N 70/8413; H10B 63/30; H10B 63/10

USPC ......................................................... 365/163
See application file for complete search history.

(56) References Cited

U.S. PATENT DOCUMENTS

| | | | |
|---|---|---|---|
| 7,456,421 B2 | 11/2008 | Lung | |
| 7,495,946 B2 | 2/2009 | Gruening-von Schwerin | |
| 7,728,319 B2 | 6/2010 | Goux | |
| 7,754,522 B2 * | 7/2010 | Liu | H10B 63/30 257/3 |
| 8,036,018 B2 | 10/2011 | Koh | |
| 8,129,214 B2 | 3/2012 | Song | |
| 8,822,967 B2 | 9/2014 | Kordus, II | |
| 9,136,471 B2 | 9/2015 | Redaelli | |
| 9,412,941 B2 | 8/2016 | Zanderighi | |
| 9,673,102 B2 | 6/2017 | Liu | |
| 10,090,193 B1 | 10/2018 | Chanemougame | |

(Continued)

FOREIGN PATENT DOCUMENTS

| | | | | |
|---|---|---|---|---|
| CN | 104517854 A | * | 4/2015 | ......... H01L 27/2454 |
| EP | 1475840 B1 | | 7/2006 | |
| WO | 2019035945 A1 | | 2/2019 | |

OTHER PUBLICATIONS

Khwa, et al., "MLC PCM Techniques to Improve Nerual Network Inference Retention Time by 105X and Reduce Accuracy Degradation by 10.8X." Accessed Feb. 5, 2022. 2 pages. Published by IEEE.

(Continued)

*Primary Examiner* — Fernando Hidalgo
(74) *Attorney, Agent, or Firm* — Matthew Zehrer

(57) ABSTRACT

An integrated circuit includes a field effect transistor (FET) and a phase change memory (PCM) cell. The PCM cell includes a heater, wherein a bottom surface of the heater is at or below a top surface of the FET.

19 Claims, 15 Drawing Sheets

(56) References Cited

U.S. PATENT DOCUMENTS

| | | | |
|---|---|---|---|
| 10,157,788 B2 | 12/2018 | Pellizzer | |
| 10,304,832 B1 | 5/2019 | Chanemougame | |
| 10,811,415 B2 | 10/2020 | Sengupta | |
| 10,985,064 B2 | 4/2021 | Zhang | |
| 11,094,594 B2 | 8/2021 | Tsao | |
| 2011/0136310 A1 | 6/2011 | Grivna | |
| 2019/0393267 A1* | 12/2019 | Pillarisetty | H10N 50/01 |
| 2020/0266169 A1 | 8/2020 | Kang | |
| 2021/0083181 A1 | 3/2021 | Chen | |
| 2021/0118798 A1 | 4/2021 | Liebmann | |

OTHER PUBLICATIONS

Kinoshita, et al., "Scalable 3-D vertical chain-cell-type phase-change memory with 4F2 poly-Si diodes." Published Jun. 12, 2012 by IEEE. In 2012 Symposium on VLSI Technology (VLSIT). 2 pages. DOI: 10.1109/VLSIT.2012.6242448.

Prasad, Divya. "Can we Bury our Scaling Problems with Buried Power Rails and Back-side Power Delivery?" Published Mar. 5, 2020 by ARM Community. 4 pages. In the 65th International Electron Devices Meeting (IEDM). https://community.arm.com/arm-research/b/articles/posts/can-we-bury-our-scaling-problems-with-buried-power-rails-and-back-side-power-delivery.

Wang, et al., "Application of phase-change materials in memory taxonomy." Published Jun. 13, 2017 by PMC. 24 pages. In Science and Technology of Advanced Materials, 2017, vol. 18, No. 1, 406-429. https://doi.org/10.1080/14686996.2017.1332455.

Wu, et al., "A 40nm Low-Power Logic Compatible Phase Change Memory Technology." Accessed Feb. 5, 2022. 4 pages. Published by IEEE.

Yang, et al., "Programming current density reduction for elevated-confined phase change memory with a self-aligned oxidation TiWOx heater." Published Nov. 26, 2014 by Applied Physics Letters. 6 pages. In Appl. Phys. Lett. 105, 213509. https://doi.org/10.1063/1.4902872.

\* cited by examiner

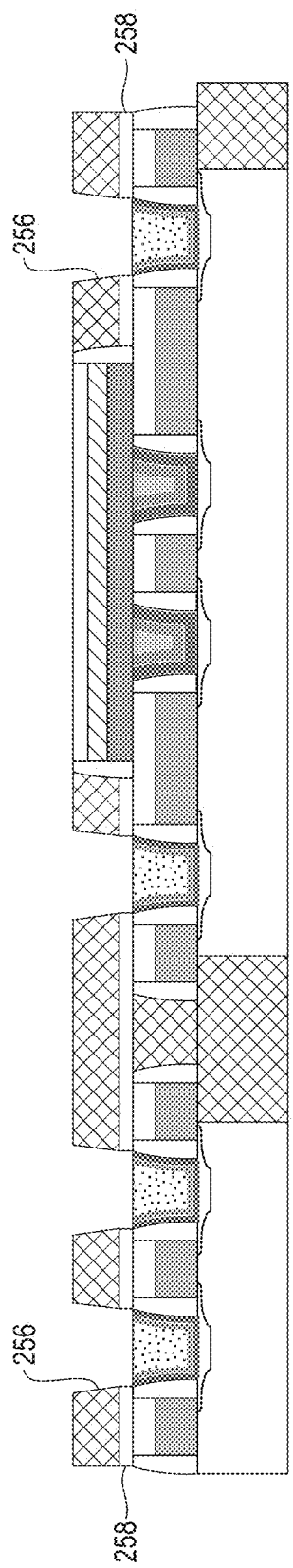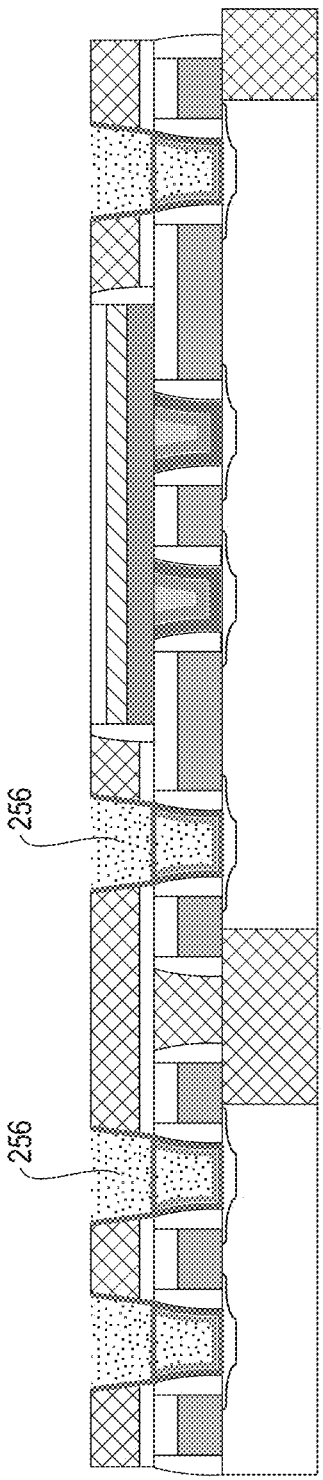

HEATER FOR PHASE CHANGE MATERIAL MEMORY CELL

BACKGROUND

The present invention relates to computer memory, and more specifically, to phase change material memory devices with contact heaters.

Phase change memory (PCM) can be utilized for both training and inference in analog computing for artificial intelligence. The PCM structures can include phase change memristive devices with tunable conductivities and overall high device resistance with high retention to minimize energy consumption. The tuning can be accomplished by forming different structural states with varying proportions of crystalline and amorphous phases of PCM material. However, these phase changes can rely on a heater positioned beneath the PCM material.

SUMMARY

According to an embodiment of the present disclosure, an integrated circuit includes a field effect transistor (FET) and a phase change memory (PCM) cell. The PCM cell includes a heater, wherein a bottom surface of the heater is at or below a top surface of the FET.

According to an embodiment of the present disclosure, a method of manufacturing an integrated circuit includes providing a substrate with a plurality of gates on the substrate and a plurality of trenches therebetween, wherein the trenches are filled with a fill material, depositing, selectively, a blocking layer over a first group of the plurality of trenches, leaving a second group of the plurality of trenches exposed, and filling the second group with a conductor material. The method further includes removing at least some of the blocking layer to expose the first group, filling the first group with a heater material, forming phase change section on at least one of the first group, wherein the phase change section comprises a phase change material, and forming an electrode on the phase change section.

According to an embodiment of the present disclosure, an integrated circuit includes a substrate and a plurality of levels stacked on the substrate. A trench silicide (TS) level is a level in direct contact with the substrate, a contact (CA/CB) level is a level in direct contact with the TS level, a metal level is a level in direct contact with the CA/CB level, and a phase change memory (PCM) cell is positioned in the TS and CA/CB levels.

DETAILED DESCRIPTION

Figure 1:
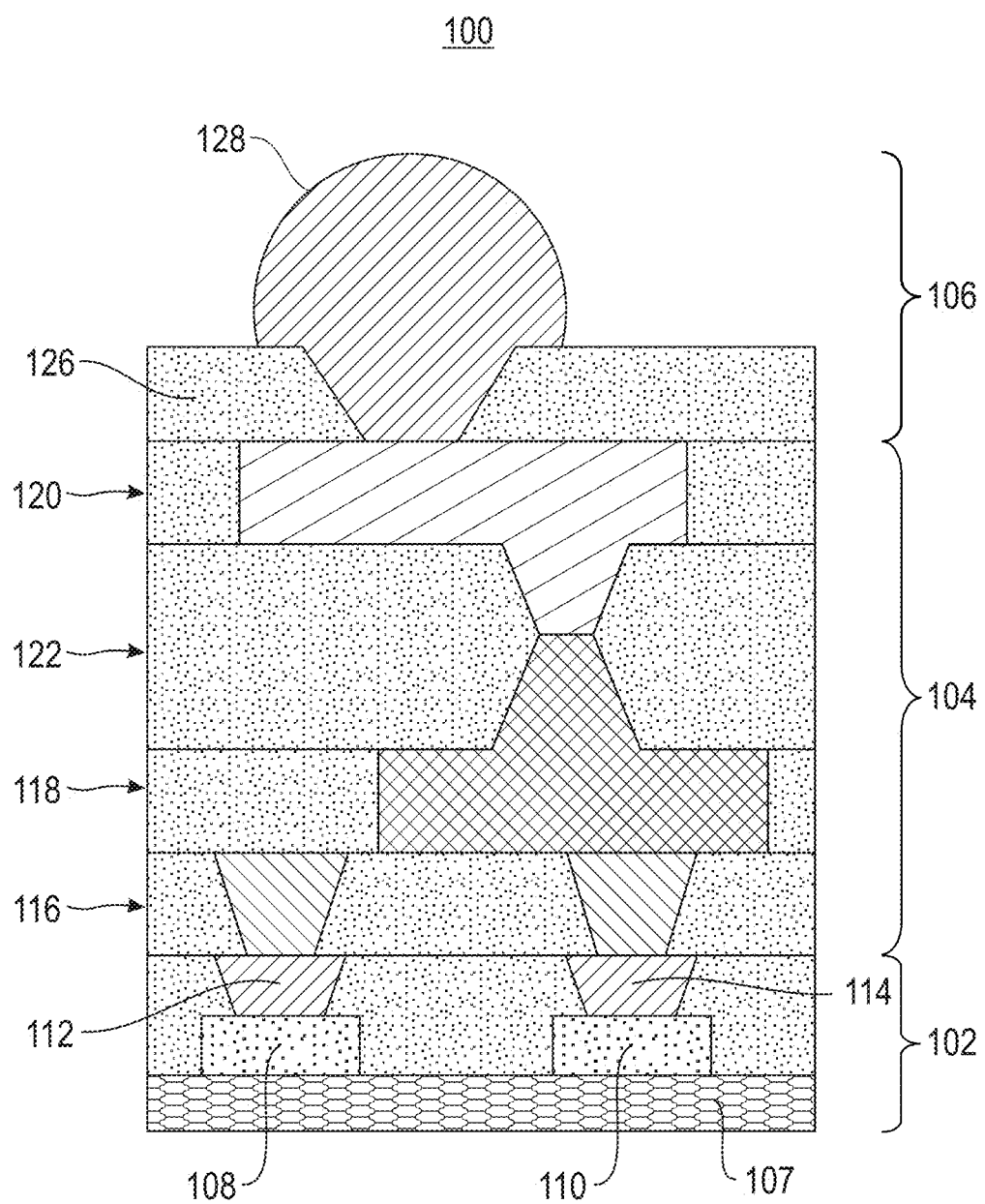
FIG. 1 is a cross-section front view of an integrated circuit (IC) chip stack, in accordance with embodiments of the present disclosure.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layers "C" and "D") are between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus. In addition, any numerical ranges included herein are inclusive of their boundaries unless explicitly stated otherwise.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition can be any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching can be any process that removes material from the wafer. Examples include etch processes (either wet or dry), chemical mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping can be the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography can be the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

FIG. 1 is a cross-section front view of IC chip stack 100 (hereinafter "stack 100"). Stack 100 comprises front end of line (FEOL) portion 102, back end of line (BEOL) portion 104, and packaging portion 106. FEOL portion 102 comprises wafer 107, transistors 108, 110 formed on wafer 107. In addition, FEOL portion 102 comprises electrical contacts 112, 114 which are adjacent to one another and are connected to transistors 108, 110, respectively. BEOL portion 104 comprises wiring layers 116, 118, 120 with insulating layer 122 in between wiring layers 118 and 120. Packaging portion 106 comprises seal layer 126 and solder bump 128.

In the illustrated embodiment, wiring layers 116-120 include lines 130, 132, 134, 136, respectively, which are electrically conductive intralayer interconnects comprised of metal material(s) that extend in various directions within their respective wiring layers 116-120. For example, line 130 extends into/out of the page in FIG. 1, whereas line 136 extends across the page in FIG. 1 (although line 136 can also extend into/out of the page). Insulating layer 122 electrically insulate wiring layers 118 and 120 from each other, although via 138 is an interlayer interconnect line that extends through insulating layer 122 to connect lines 134 and 136. To insulate the electrically conductive features, FEOL portion 102 and BEOL portion 104 include dielectric material 140 therebetween.

Depicted in FIG. 1 is one embodiment of stack 100, to which there are alternative architectures. For example, stack 100 can have fewer or greater transistors, electrical contacts, wiring layers, and/or insulating layers. In such embodiments, the border between FEOL portion 102 and BEOL portion 104 can be at a different location (e.g., between wiring layers 116 and 118).

Figure 2A:
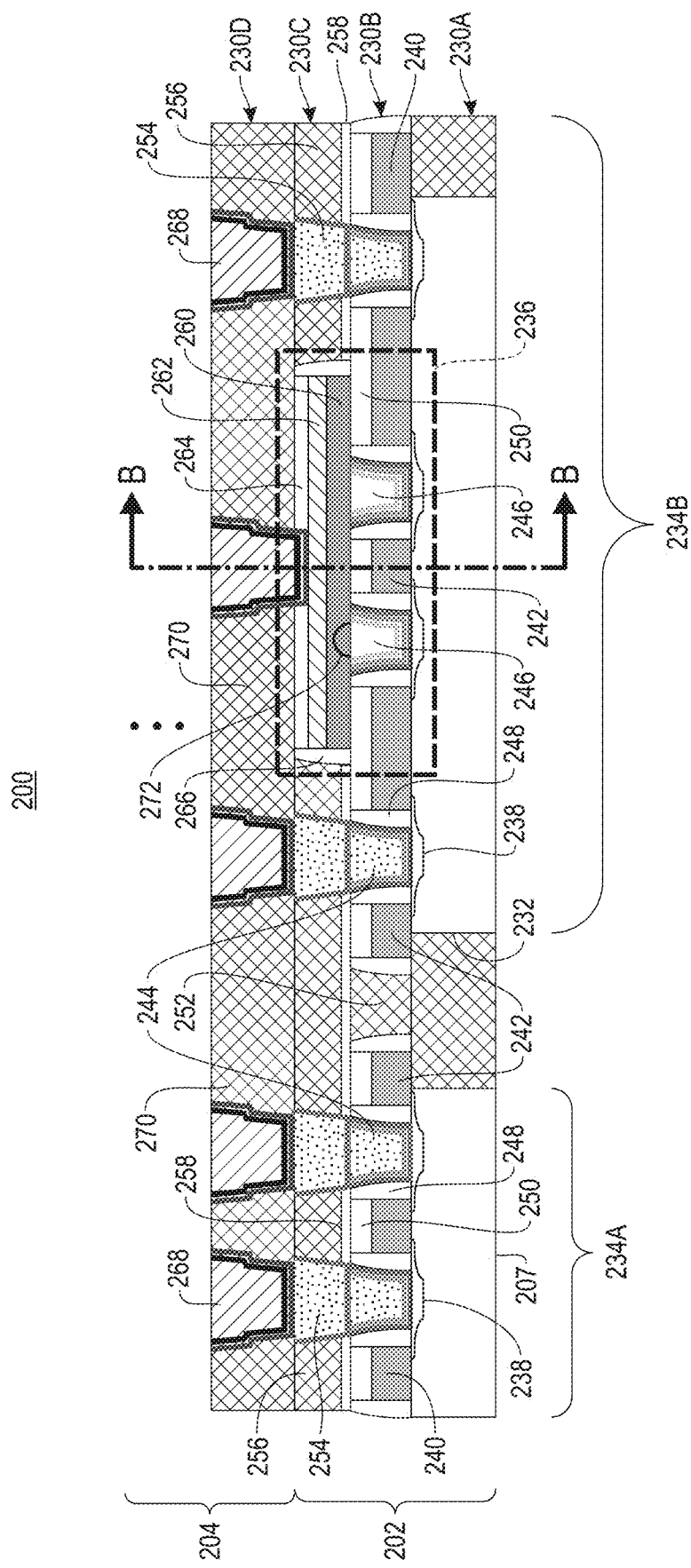
FIG. 2A is a cross-section front view of an IC chip stack along line A-A in FIG. 2B, in accordance with an embodiment of the present disclosure.
Figure 2B:
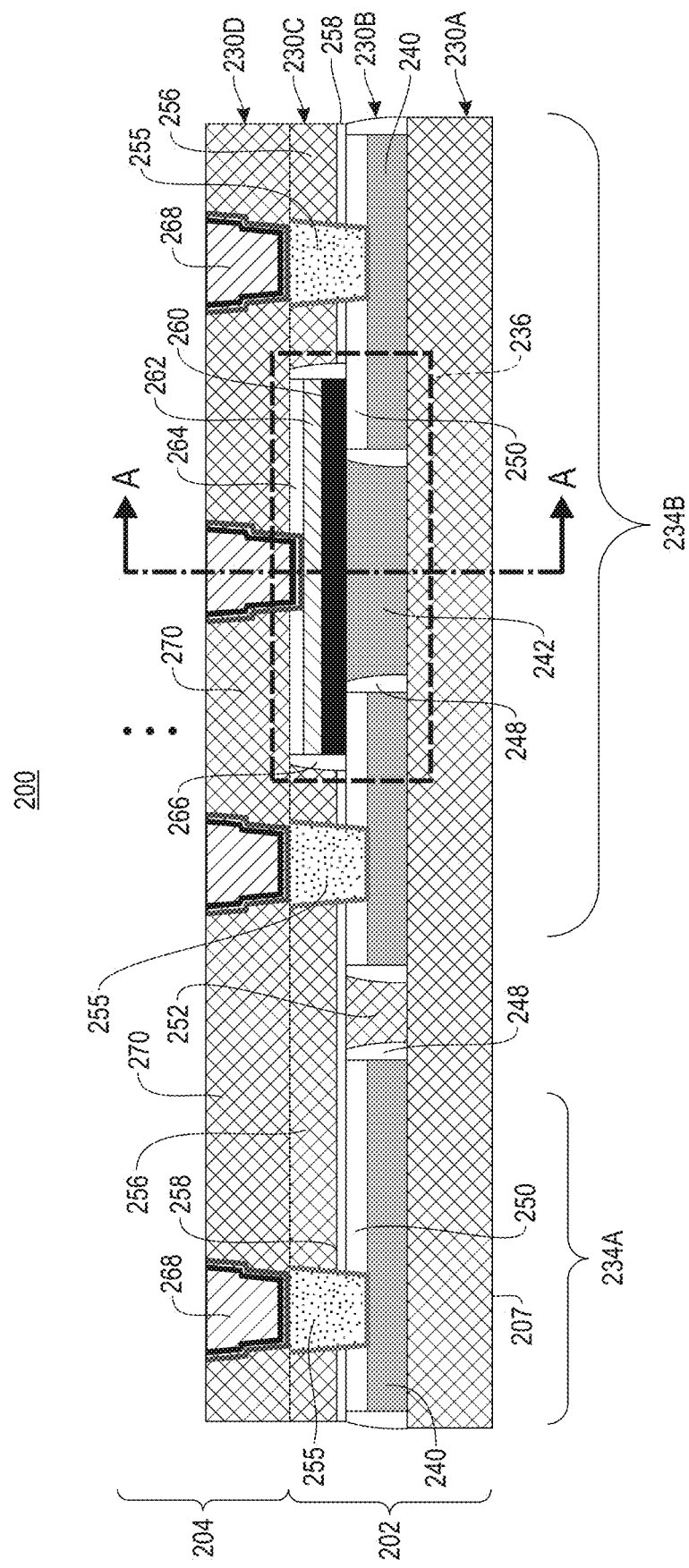
FIG. 2B is a cross-section side view of the IC chip stack along line B-B in FIGS. 2A and 2B, in accordance with an embodiment of the present disclosure.

FIG. 2A is a cross-section front view of IC chip stack 200 (hereinafter "stack 200") along line A-A in FIG. 2B. FIG. 2B is a cross-section side view of stack 200 along line B-B in FIG. 2A. While only four levels 230A-230D (collectively "levels 230") of stack 200 are shown in FIGS. 2A and 2B, more levels can be included. For example, in some embodiments, stack 200 is a portion of stack 100, shown in FIG. 1.

In the illustrated embodiment, level 230A comprises wafer 207 which is comprised of a semiconducting substrate (e.g., silicon (S) or germanium (Ge)) with shallow trench isolation (STI) features such as trench 232. Level 230A can be called the substrate level of stack 200. Trench 232 is filled with dielectric material (e.g., silicon dioxide ($SiO_2$) to reduce electric current leakage between logic structure 234A and PCM structure 234B (collectively "structures 234"). Logic structure 234A includes some traditional features of ICs, and PCM structure 234B includes some traditional features of ICs along with PCM cell 236. For example, the top of wafer 207 can include source/drain terminals 238, which are doped portions of wafer 207.

In the illustrated embodiment, level 230B comprises logic gates 240, dummy gates 242, interconnects 244, heaters 246, spacers 248, caps 250, and filler 252. Level 230B can be called the trench silicide (TS) level of stack 200. Logic gates 240 extend from the bottom of level 230B, partway through level 230B, and are topped with caps 250 which extend to the top of level 230B. A logic gate 240 connected with two source/drain terminals 238 (one of which would be a source and the other of which would be a drain) forms a field-effect transistor (FET). Dummy gates 242 are gate positions that at least partly overlap trench 232 or that are completely overlapped by phase change section 260. Interconnects 244 and heaters 246 extend through level 230B from source/drain terminals 238 to the top of level 230B. Filler 252 extends through level 230B from the top of trench 232 to the top of level 230B. Spacers 248 are positioned between logic gates 240/dummy gates 242 and interconnects 244/heaters 246/filler 252.

In the illustrated embodiment, level 230C comprises interconnects 254, logic interconnects 255, insulator 256, cap 258, phase change section 260, top electrode 262, cap 264, and spacer 266. Level 230C can be called the contacts A (in one direction) and contacts B (in an orthogonal direction) (CA/CB) level of stack 200. Interconnects 254 extend through level 230C from interconnects 244 to the top of level 230C. Logic interconnects 255 extend from the tops of logic gates 240, through level 230C, to the top of level 230C. Phase change section 260 extends from level 230B partly across level 230C. Phase change section 260 is in direct contact with both heaters 246 as well as overlapping all of one logic gate 240 and parts of two other logic gates 240. Top electrode 262 extends from phase change section 260 partly across level 230C. Cap 264 extends from top electrode 262 to the top of level 230C. Spacer 266 extends through level 230C from caps 250 to the top of level 230C alongside phase change section 260, top electrode 262, and cap 264. Cap 258 extends from level 230B partly across level 230C, and insulator 256 extends from cap 258 to the top of level 230C. Insulator 256 and cap 258 extend alongside and in between interconnects 254 and spacer 266.

In the illustrated embodiment, level 230D comprises interconnects 268 and insulator 270. Interconnects 268 extend through level 230D from interconnects 254 to the top of level 230D. Insulator 270 extends through level 230D from level 230C to the top of level 230D alongside and in between interconnects 268. Level 230D can be called the first metal level of stack 200. It is the lowest level of BEOL 204 since levels 230A-230C are all in FEOL 202.

In the illustrated embodiment, the bottoms of heaters 246 are each in direct contact with and electrically connected to the top of their corresponding source/drain terminals 238. The bottom of phase change section 260 is in direct contact with and electrically and thermally connected to the tops of heaters 246. While the widths of phase change section 260, top electrode 262, and cap 264 are the same, the widths of heaters 246 is substantially smaller (e.g., two to seven times smaller, or about five times smaller). Thereby, PCM cell 236 can be said to have a mushroom-type configuration wherein an electrical signal (i.e., electrical current) can flow from a source/drain terminal 238 to an interconnect 268 through a heater 246, phase change section 260, and top electrode 262. In some embodiments, the widths of heaters 246 are between 20 nanometers (nm) and 60 nm, and the widths of phase change section 260, top electrode 262, and cap 264 are greater than 100 nm. Furthermore, in some embodiments, there is only one heater 246 in PCM cell 236.

In the illustrated embodiment, top electrode 262 is comprised of a very electrically conductive material, such as metal or metallic compound, for example, titanium nitride (TiN) or tungsten (W). Interconnects 244, 254, 255, and 268 can also be comprised of a very electrically conductive material, such as metal or metallic compound. In some embodiments, interconnects 244 and 254 are comprised of W (since they are in FEOL 202), and interconnects 268 are comprised of copper (Cu) (since they are in BEOL 204). Heaters 246 are electrodes that are comprised of TiN or a higher resistance metal, such as, for example, titanium tungsten (TiW), tantalum nitride (TaN), or titanium aluminide (TiAl), and has a relatively narrow cross-sectional area, which focuses electrical current that is run through PCM cell 236. This allows heaters 246 to generate heat through resistive heating during a pulse of electricity, which can be used to selectively change the temperature of phase change section 260 locally, for example, above the crystallization temperature and the melting temperature of phase change section 260. In addition, heaters 246 can be comprised of multiple different electrically conductive materials that can be arranged in multiple layers (which is shown in FIG. 2A).

In the illustrated embodiment, spacers 248, caps 250, filler 252, insulator 256, cap 258, cap 264, spacer 266, and insulator 270 can be comprised of a dielectric (electrical insulating) material, such as, for example, silicon nitride (SiN), silicon oxide ($SiO_2$), silicon nitride carbide (SiNC), or tetraethyl orthosilicate (TEOS). In some embodiments, all of spacers 248, caps 250, filler 252, insulator 256, cap 258, cap 264, spacer 266, and insulator 270 are the same material, and in other embodiments, different materials are used for some or all of spacers 248, caps 250, filler 252, insulator 256, cap 258, cap 264, spacer 266, and insulator 270. For example, spacers 248, caps 250, caps 258, cap 264, and spacer 266 can be comprised of SiN, while filler 252, insulator 256, and insulator 270 can be comprised of $SiO_2$.

In the illustrated embodiment, phase change section 260 is composed essentially of a phase change material such as a germanium-antimony-tellurium (GST), gallium-antimony-tellurium (GaST), or silver-iridium-antimony-telluride (AIST) material, although other materials can be used as appropriate. Examples of other phase change materials can include, but are not limited to, germanium-tellurium compound material (GeTe), silicon-antimony-tellurium (Si—Sb—Te) alloys, gallium-antimony-tellurium (Ga—Sb—Te) alloys, germanium-bismuth-tellurium (Ge—Bi—Te) alloys, indium-tellurium (In—Se) alloys, arsenic-antimony-tellurium (As—Sb—Te) alloys, silver-indium-antimony-tellurium (Ag—In—Sb—Te) alloys, Ge—In—Sb—Te alloys, Ge—Sb alloys, Sb—Te alloys, Si—Sb alloys, Ge—Te alloys and combinations thereof. The terms "composed essentially" and "consist essentially," as used herein with respect to materials of different layers, indicates that other materials, if present, do not materially alter the basic characteristics of the recited materials. For example, phase change section 260 consisting essentially of GST material does not include other materials that materially alter the basic characteristics of the GST material.

In the illustrated embodiment, PCM cell 236 can be operated as a memory cell by passing an electrical current pulse from, for example, the left source/drain terminal 238 (beneath the left heater 246) to top electrode 262 to program the left side of PCM cell 236. This can be done at a variety of voltages and/or for a variety of durations to read or write a value on the left of PCM cell 236. For example, to write, a high voltage can be used (e.g., 1 volt (V) to 5 V) for a short duration, which can cause heater 246 to locally heat phase change section 260 beyond the melting point of phase change section 260. Once the flow of current ceases, phase change section 260 can cool down rapidly, which forms amorphous zone 272 in a process called "resetting". Zone 272 is a dome-shaped region of phase change section 260 having an amorphous configuration, although the remainder of phase change section 260 is still in a polycrystalline configuration. In general, this amorphous configuration has no definite structure. However, there can be local, disjoint crystalline nuclei (i.e., small, crystallized regions of phase change section 260) present in zone 272. The creation of zone 272 can cause the electrical resistance across PCM cell 236 to increase as compared to a solely polycrystalline configuration (a la the right side of phase change section 260 in FIG. 2A). These resistance values of PCM cell 236 can be read without changing the phase of phase change section 260 (including that of zone 272) or the resistance value of PCM cell 236, for example, by sending a current pulse at a low voltage (e.g., 0.2 V) from a source/drain terminal 238 to top electrode 262.

In addition, phase change section 260 can be rewritten and returned back to a solely polycrystalline configuration by "setting" PCM cell 236. One way to rewrite phase change section 260 uses a high voltage electrical pulse (e.g., 1 V to 5 V) for a short period of time (e.g., between 20 nanoseconds (ns) and 200 ns, or about 50 ns), which can cause phase change section 260 to heat up beyond the crystallization point phase change section 260 but not to its melting point. Since the crystallization temperature is lower than the melting temperature, once the flow of current ceases, phase change section 260 can anneal and form crystals. Another way to rewrite phase change section 260 uses an electrical pulse with a relatively long trailing edge (e.g., 0.5 microseconds (ms) to 2 ms, or about 1 ms) (as opposed to a square pulse with a relatively short trailing edge on the order of nanoseconds) that is strong enough to heat phase change section 260 beyond the melting point of phase change section 260, after which, phase change section 260 is cooled down slowly, allowing crystals to form. Either of these processes cause the electrical resistance across PCM cell 236 to decrease as compared to having an amorphous zone 272. This new resistance value can then be read using current at a low voltage (e.g., 0.2 V) without changing the phase of phase change section 260 or the resistance value of PCM cell 236.

In some embodiments, the melting temperature phase change section 260 can be around 600° C. In some embodiments, the crystallization temperature of phase change section 260 can be around 180° C. In addition, the process of setting and resetting PCM cell 236 can occur repeatedly, and in some embodiments, different zones 272 with different resistances can be created in one or both sides of phase change section 260 (e.g., due to having different sizes of zone 272 and/or amounts of crystallization nuclei in zone 272). This allows for PCM cell 236 to have various distinct resistances that can be created by varying the resetting parameters. Thereby, if PCM cell 236 is considered to represent information digits, these digits can be non-binary (as opposed to traditional bits). However, in some embodiments, PCM cell 236 can be used as a bit by either having or not having a uniform amorphous zone 272 in one or both sides of phase change section 260. In such embodiments, PCM cell 236 can have a high resistance (a.k.a., low voltage output or "0") or low resistance (a.k.a., high voltage output or "1") on each side. In either configuration, the memory storage properties of PCM cell 236 can be beneficial in, for example, artificial intelligence and machine learning applications.

The components and configuration of IC chip stack 200 allow for several notable features to be present. For example, PCM cell 236 is in FEOL 202 of stack 200. This means that the bottom surfaces of heaters 246 are at or below a top surfaces of logic gates 240 (i.e., the top of the FETs). Furthermore, the bottom surface of phase change section 260 is at or below the top surfaces of logic interconnects 255, and the top surface of phase change section 260 is at or below the top surfaces of logic interconnects 255. For another example, the bottoms of heaters 246 are in direct contact with wafer 207. For another example, heaters 246 are in the same level 230 as logic gates 240, and phase change section 260 is in the same level 230 as interconnects 254 and 255. For another example, the caps 250 that phase change section 260 overlaps electrically isolate phase change section 260 from the logic gates 240 that it overlaps. For another example, the width of phase change section 260 allows for multiple heaters 246 to be positioned underneath and function independently (i.e., to set and reset separate amorphous zones 272), which increases the density of PCM cell 236 (as opposed to having two completely distinct PCM cells 236). For another example, the electrical resistance of heaters 246 can be tuned and/or reduced by adjusting the properties of their respective source/drain terminals 238.

Figure 3A:
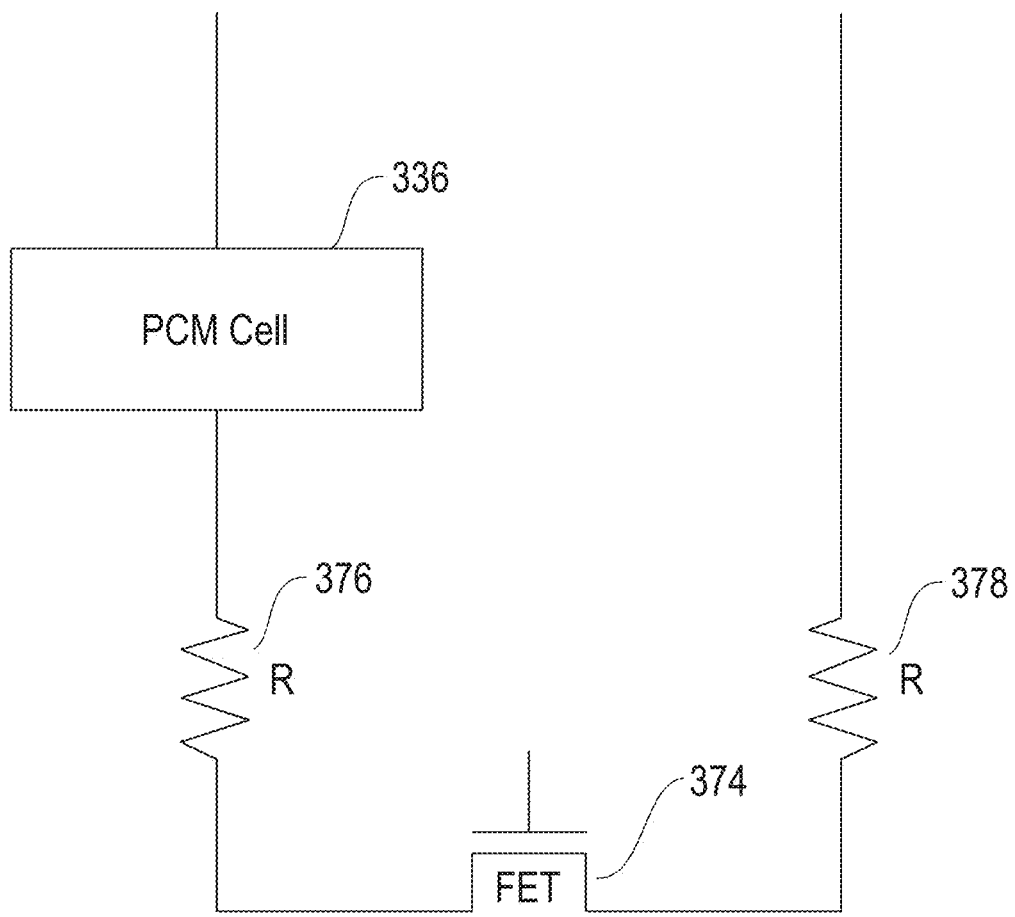
FIG. 3A is a circuit diagram of a portion of a prior art IC chip stack, in accordance with an embodiment of the present disclosure.

FIG. 3A is a circuit diagram of a portion of prior art IC chip stack 300 (hereinafter "PA stack 300"). In the illustrated embodiment, PA stack 300 includes FET 374, load 376, and PCM cell 336 in series as well as load 378. In PA stack 300, PCM cell 336 is located in the BEOL portion (ex. at the 5.6× level), so load 376 is positioned between PCM cell 336 and FET 374. Load 376 represents the resistance of the numerous components and features between PCM cell 336 and FET 374.

Figure 3B:
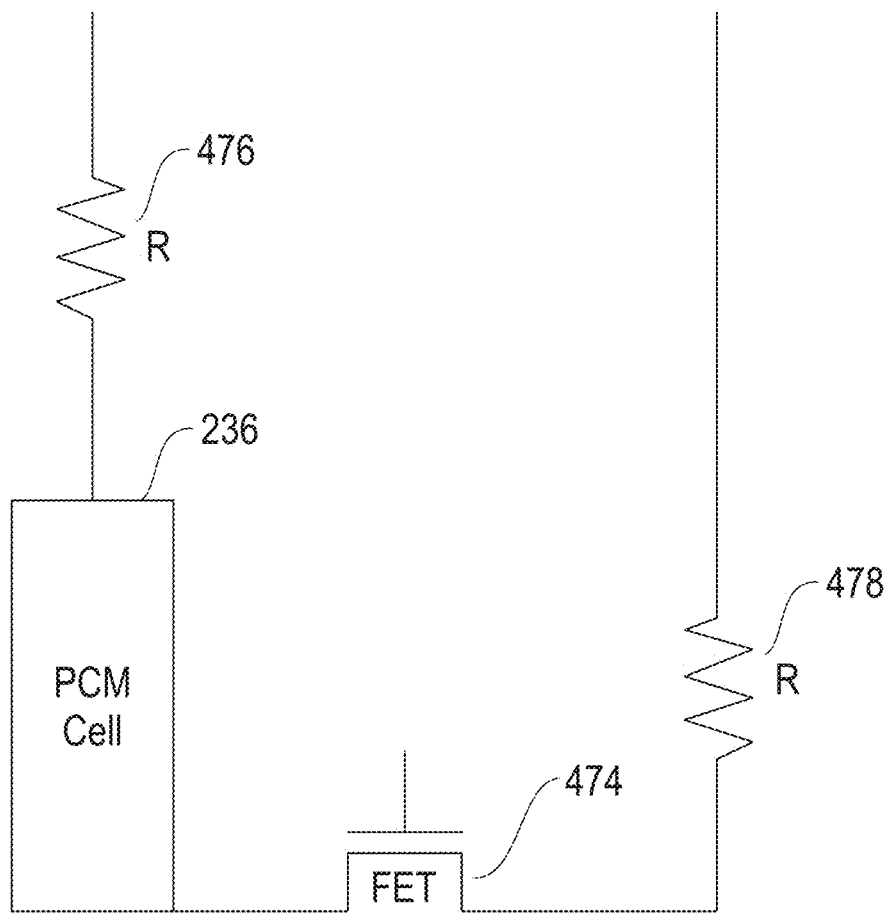
FIG. 3B is a circuit diagram of a portion of the IC chip stack of FIGS. 2A and 2B, in accordance with an embodiment of the present disclosure.

FIG. 3B is a circuit diagram of a portion of stack 200. In the illustrated embodiment, PA stack 200 includes FET 474, load 476, and PCM cell 236 in series as well as load 478. In stack 200, PCM cell 236 is located in FEOL portion 102, so PCM cell 236 is positioned directly adjacent to FET 474 and before load 476.

At least some of the benefits of stack 200 over PA stack 300 are attributable to the proximity of PCM cell 236 to FET 474 because phase change memory cells can be very sensitive to electrical resistance. From a circuitry perspective, the lack of parasitic resistance (e.g., from load 476) between FET 474 and PCM cell 236 allows for a lower programming current than for PCM cell 336 (due to its greater parasitic resistance, e.g., from load 376). The lower programming current allows for a reduced area of FET 474, reduced area of PCM cell 236, reduced power density, improved speed of programming, and increased density of memory cells. In addition, the variation in load 476 across individual stacks 200 due to, for example, manufacturing tolerances will not affect the functioning of PCM cell 236. This prevents the analog function failures that can occur in PCM cell 336 due to variation in load 374 across individual PA stacks 300.

Figure 4:
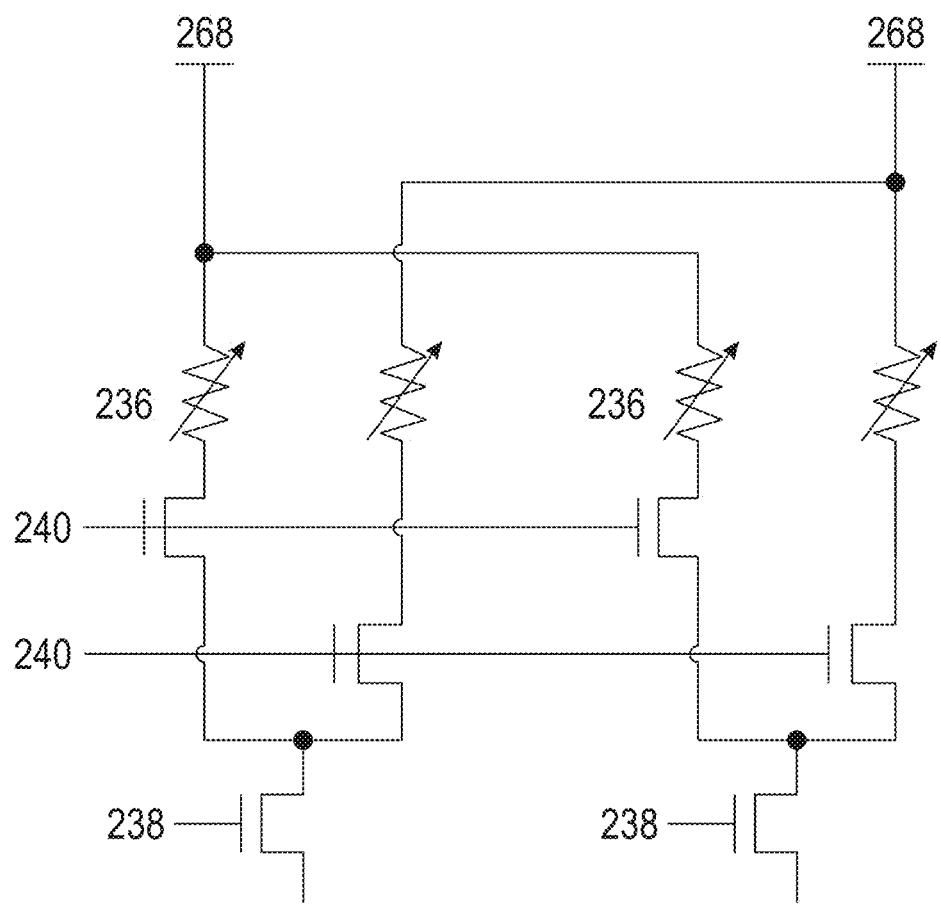
FIG. 4 is a circuit diagram of a larger portion of the IC chip stack of FIGS. 2A and 2B, in accordance with an embodiment of the present disclosure.

FIG. 4 is a circuit diagram of a larger portion of stack 200. In the illustrated embodiment, the left and right PCM cells 236 shown in FIG. 2A are the left and right portions of PCM cell 236 in the circuit diagram (since heaters 246 can operate independently of one another). The circuit diagram also indicates two more PCM cells (not labeled) that are not shown in FIG. 2A or 2B because they are out of plane of those views. Stack 200 further includes two input logic gates 240, which can represent the logic gate 240 to the left of the leftmost heater 246 and the logic gate 240 to the right of the rightmost heater 246. In addition, stack 200 includes source/drain terminals 238 and two output interconnects 268. The source/drain terminals 238 can represent the source/drain terminal 238 to the left of the leftmost heater 246 and the source/drain terminal 238 to the right of the rightmost heater 246. The output interconnects 238 can represent the interconnect 238 connected to top electrode 262 (which can go to, for example, a power supply (not shown)) and the interconnect 238 to the left of the interconnect 238 connected to top electrode 262 (which can go to, for example, a peripheral circuit (e.g., a sense amplifier) (not shown)).

Figure 5:
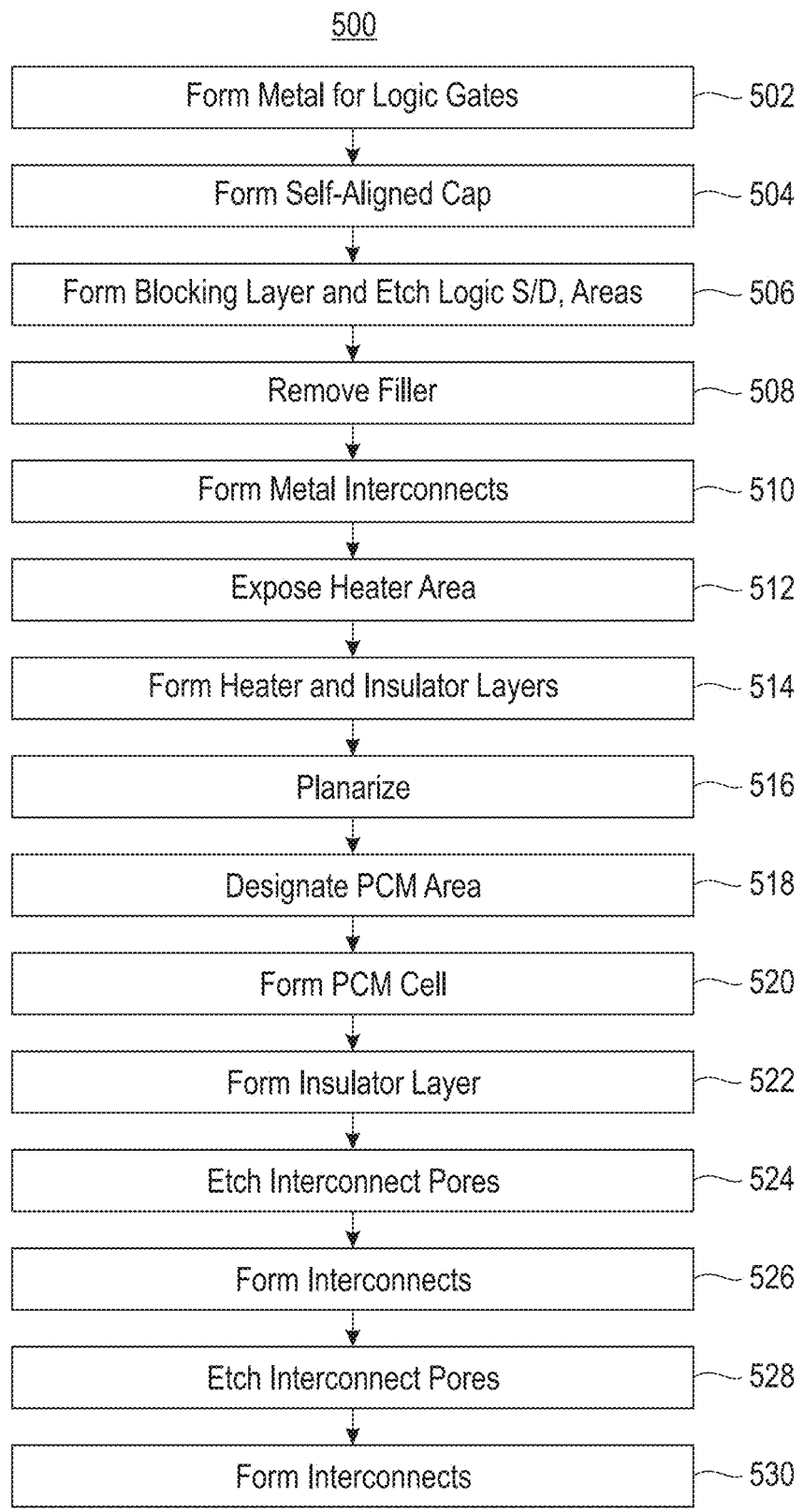
FIG. 5 is a flowchart of a method of manufacturing the IC chip stack of FIGS. 2A and 2B, in accordance with an embodiment of the present disclosure.
Figure 6A:
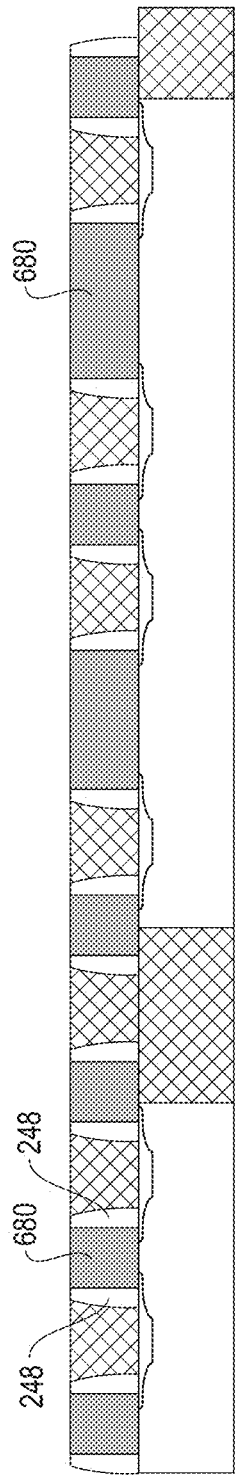
FIGS. 6A-6O are a series of cross-section views of the method of FIG. 5 of manufacturing the IC chip stack of FIGS. 2A and 2B, in accordance with an embodiment of the present disclosure.
Figure 6B:
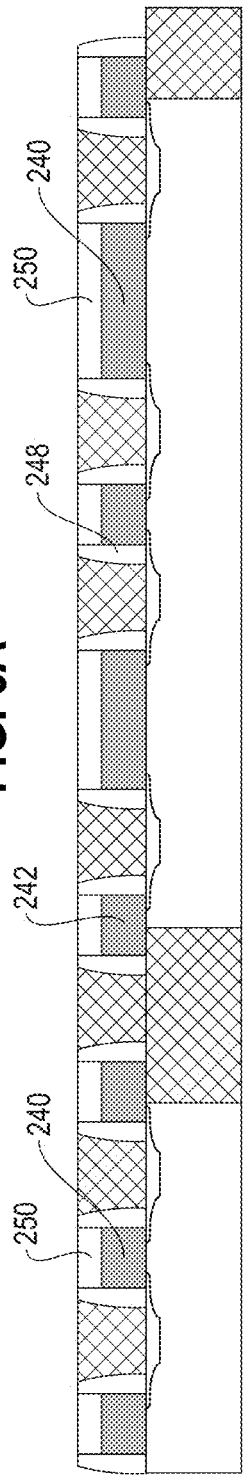
Figure 6C:
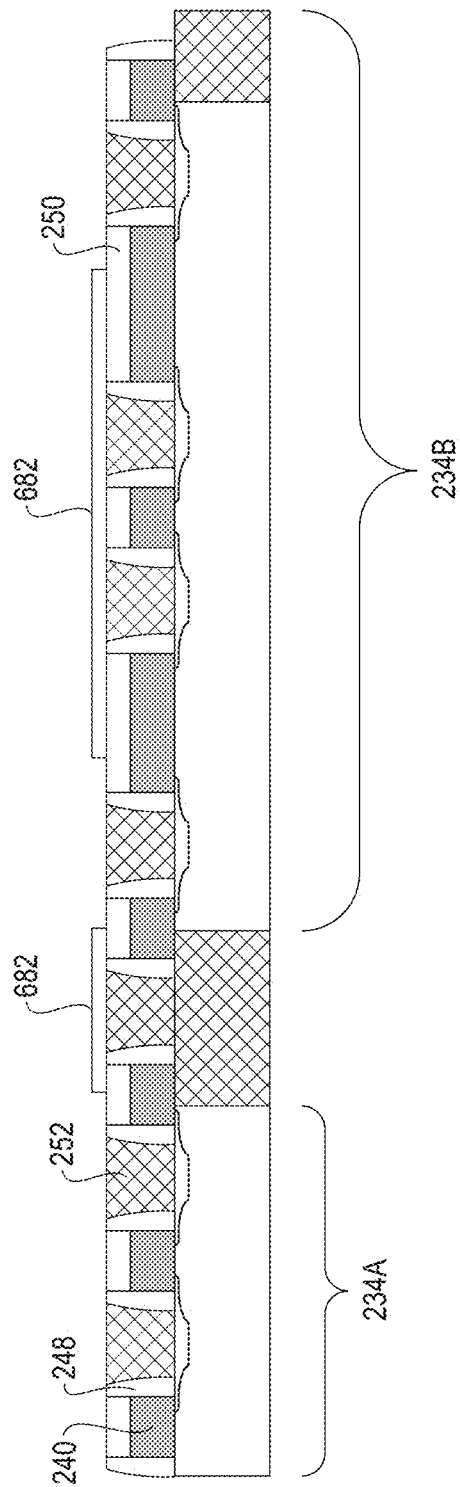
Figure 6D:
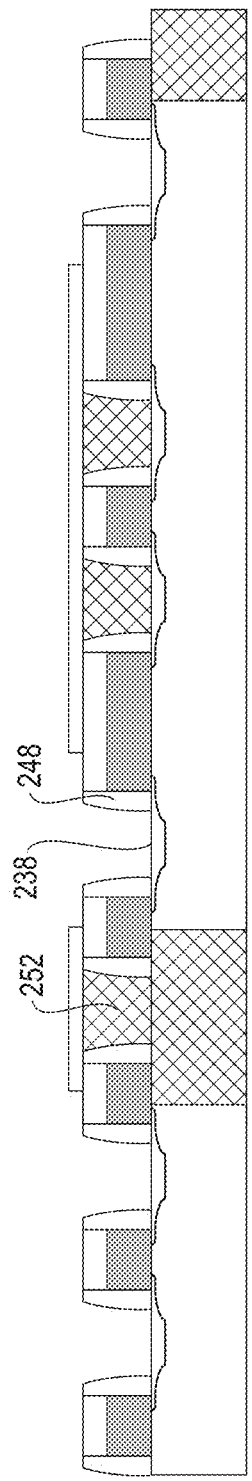
Figure 6E:
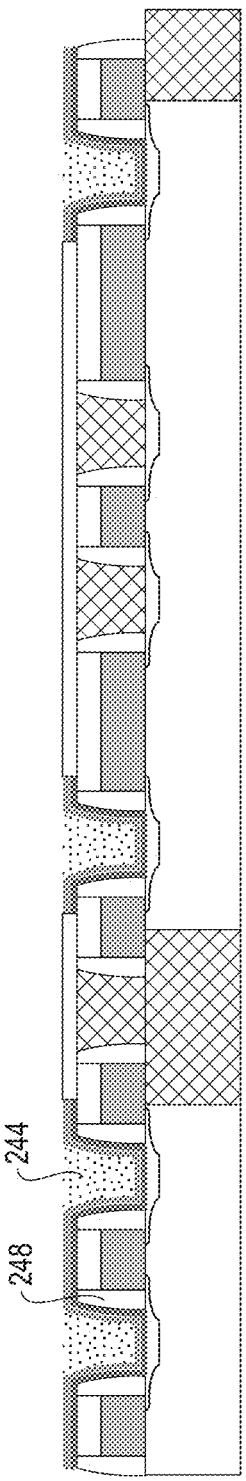
Figure 6F:
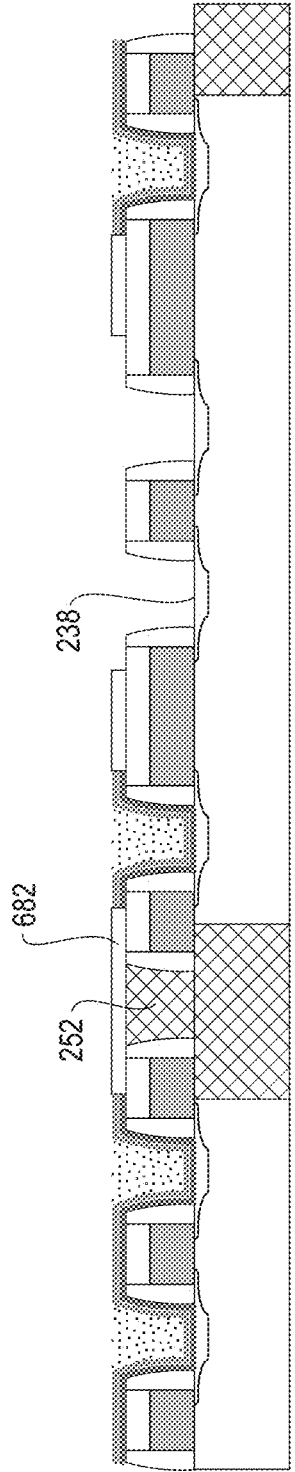
Figure 6G:
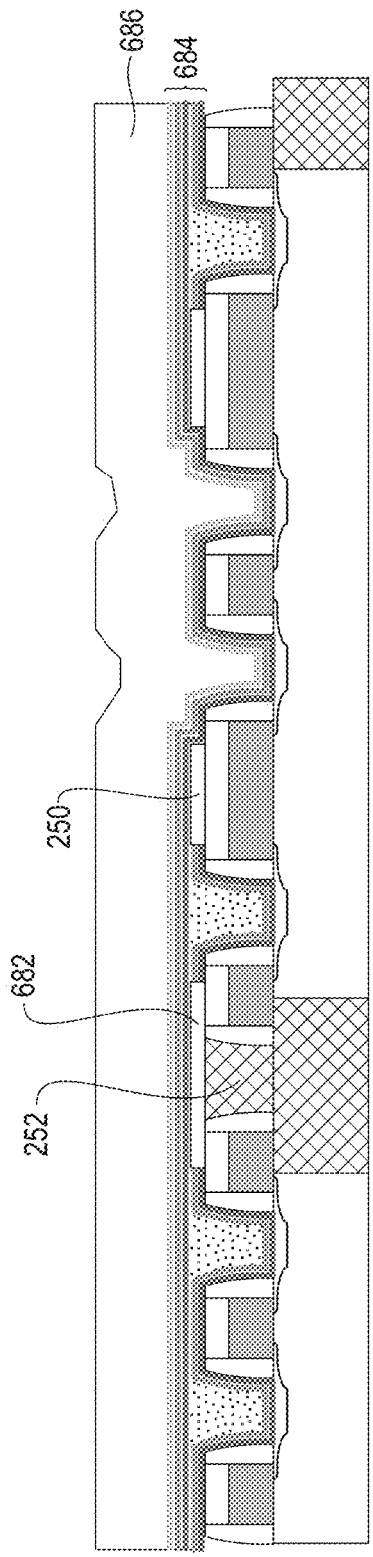
Figure 6H:
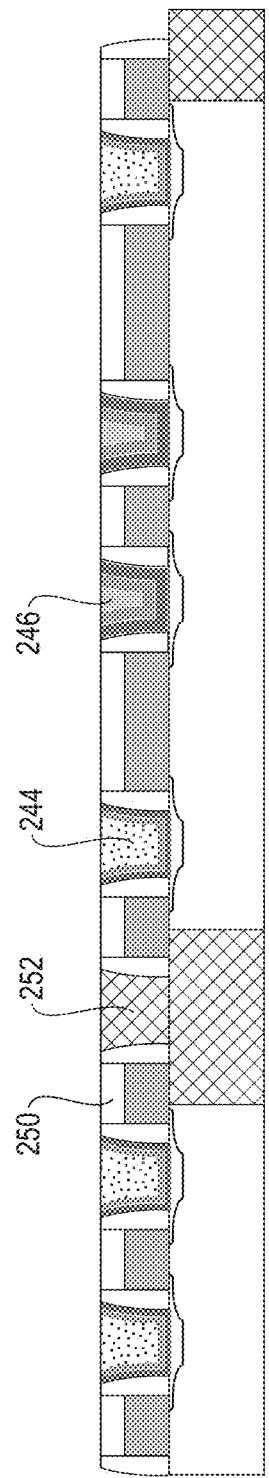
Figure 6I:
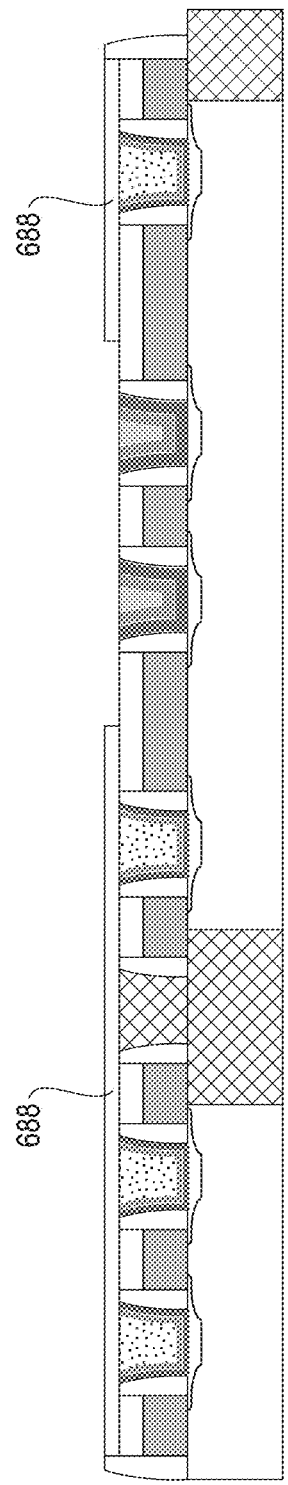
Figure 6J:
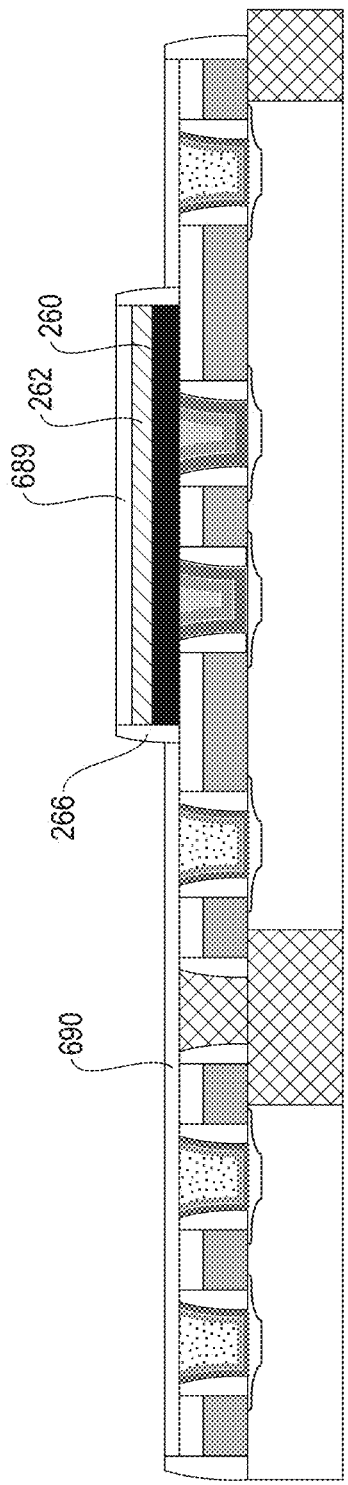
Figure 6K:
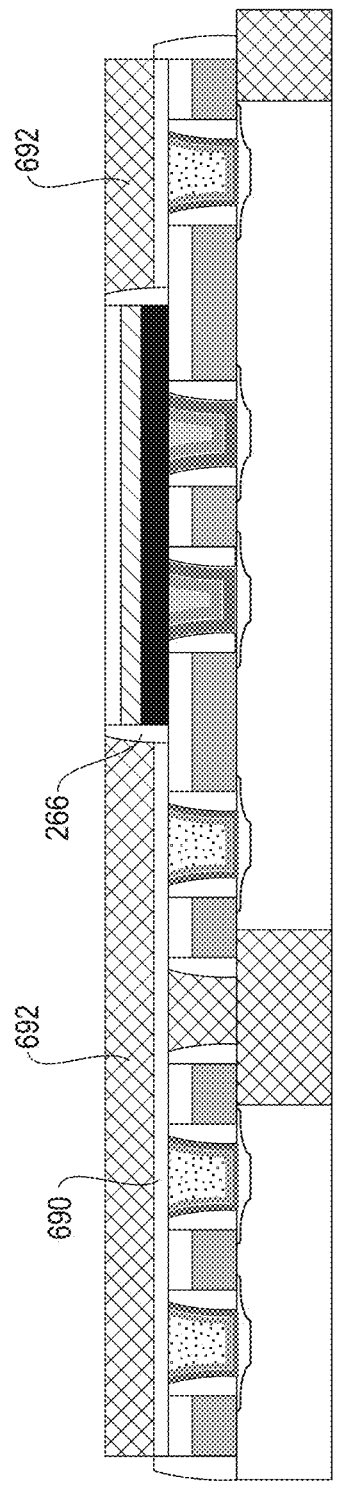
Figure 6N:
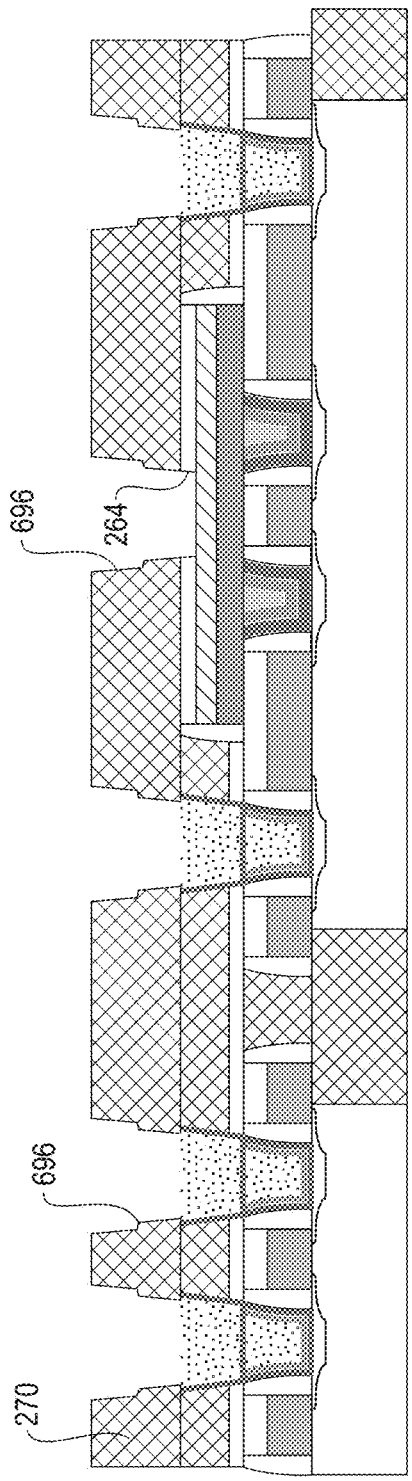
Figure 6O:
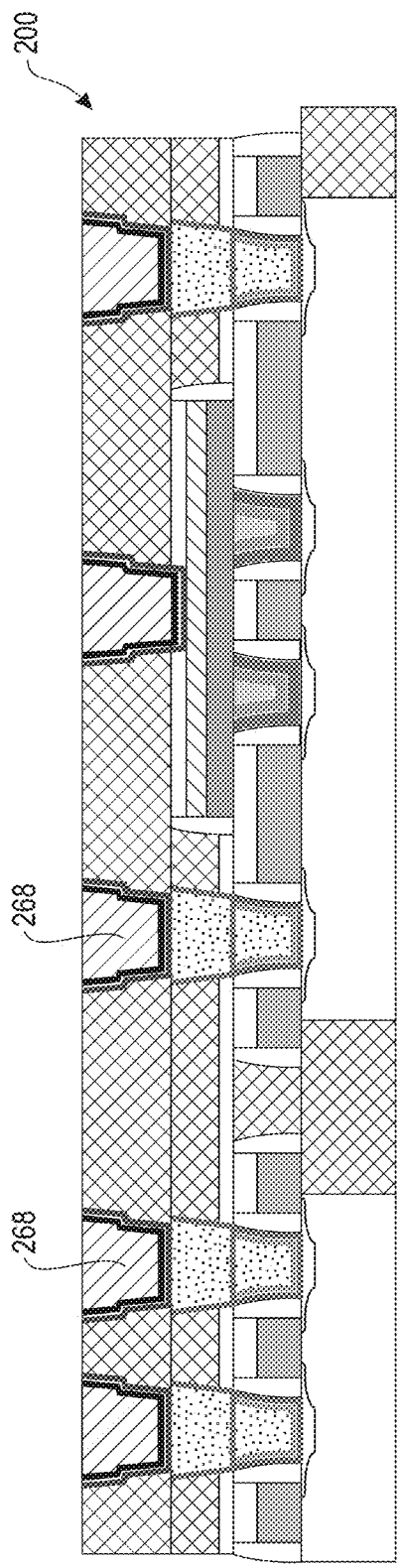

FIG. 5 is a flowchart of method 500 of manufacturing stack 200 of FIG. 2A. FIGS. 6A-6O are a series of cross-section views of the method of FIG. 5 of manufacturing stack 200. FIGS. 5 and 6A-6O will now be discussed in conjunction with one another wherein each operation of method 500 is illustrated by one of FIGS. 6A-6O. In addition, during this discussion, references may be made to features of PCM cell 236 shown in FIGS. 2A and 2B, however, some features may be omitted for the sake of simplicity.

In the illustrated embodiment, method 500 starts at operation 502, wherein logic gate metal 680 is formed between the vertical sides of spacers 248. At operation 504, logic gate metal 680 is selectively etched down, and caps 250 are formed to complete logic gates 240 and dummy gates 242. Caps 250 can be said to be self-aligned because once the top portions of logic gate metal 680 are removed, the material for caps 250 is naturally constrained in the horizontal plane by spacers 248 (i.e., no masking is required to form caps 250). At operation 506, blocking layer 682 is formed on spacers 248, caps 250, and filler 252. Then, blocking layer 682 is selectively etched to expose the entirety of the top of logic structure 234A and selected areas of the top of PCM structure 234B. Specifically, the group of areas where filler 242 should be retained (temporarily or permanently) remain covered, which includes where phase change material 260 will reside. This allows heaters 246 to be filled with different materials from interconnects 244. In some embodiments, blocking layer 682 is comprised of a nitride material.

In the illustrate embodiment, at operation 508, the unblocked filler 252 is removed to expose some source/drain terminals 238 and the corresponding curved sides of spacers 248. At operation 510, interconnects 244 are formed between spacers 248, for example, by depositing a metal liner(s) and/or core metal. At operation 512, some of blocking layer 682 and the underlying filler 252 is removed to expose the source/drain terminals 238 that will correspond to heaters 246. At operation 514, heater layers 684 and insulator layer 686 are formed on the exposed source/drain terminals 238 and the other exposed components, such as, for example, caps 250 and blocking layer 682. In some embodiments, heater layers 684 are a sandwich of TaN/TiN/TaN layers, and insulator layer 686 is a nitride material. Heaters 246 can be said to be self-aligned because once filler 252 is removed, heater layers 684 and insulator layer 686 are naturally constrained in the horizontal plane by spacers 248 (i.e., no masking is required to form heaters 246).

At operation 516, planarization (e.g., chemical mechanical planarization) is performed to remove blocking layer 682, heater layers excess 684, and excess insulator layer 686; to expose interconnects 244, caps 250, filler 252; and to form heaters 246. At operation 518, blocking layer 688 is formed to designate the group of areas for phase change material 260. At operation 520, phase change material 260, top electrode 262, cap layer 689, and spacers 266 are formed to complete PCM cell 236, and cap layer 690 is also formed.

In the illustrated embodiment, at operation 522, insulator layer 692 is formed on cap layer 690 and spacers 266. At operation 524, interconnect pores 694 are etched in cap layer 690 and insulator layer 692 to form insulator 256 and cap 258. At operation 526, interconnects 254 are formed. At operation 528, an insulator layer is formed, and interconnect pores 696 are etched into the insulator layer and cap layer to form cap 264 and insulator 270. At operation 530, interconnects 268 are formed to complete stack 200.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit comprising:
   a field effect transistor (FET);
   an interconnect connected to a gate of the FET; and
   a phase change memory (PCM) cell comprising a phase change section and a first heater, wherein a bottom surface of the first heater is at or below a top surface of the gate, and wherein a top surface of the phase change section is at or below the top surface of the interconnect.

2. The integrated circuit of claim 1, wherein:
   the phase change section further comprises a phase change material; and
   a bottom surface of the phase change section is below the top surface of the interconnect.

3. The integrated circuit of claim 2, wherein:
   the PCM cell further comprises a second heater;
   a bottom surface of the second heater is at or below a top surface of the gate; and
   a top surface of the first heater and a top surface of the second heater are in direct contact with the bottom surface of the phase change section.

4. The integrated circuit of claim 2, wherein:
   the first heater has a first width;
   the phase change section has a second width; and
   the second width is greater than or equal to twice the first width to form a mushroom-type phase change cell.

5. The integrated circuit of claim 2, wherein:
   the phase change section overlaps the gate; and
   a first cap is positioned between the phase change section and the gate.

6. The integrated circuit of claim 1, wherein:
   the FET comprises a substrate; and
   the bottom surface of the first heater is in direct contact a source/drain terminal.

7. The integrated circuit of claim 6, wherein the source/drain terminal is a doped portion of the substrate.

8. The integrated circuit of claim 1, wherein a width of the bottom surface of the first heater is inset within a width of the source/drain terminal.

9. The integrated circuit of claim 1, further comprising a second cap on top of the gate.

10. The integrated circuit of claim 1, wherein the FET has a fin-shaped configuration.

11. A method of manufacturing an integrated circuit, the method comprising:
    providing a substrate with a plurality of gates on the substrate and a plurality of trenches therebetween, wherein the trenches are filled with a fill material;
    depositing, selectively, a blocking layer over a first group of the plurality of trenches, leaving a second group of the plurality of trenches exposed;
    filling the second group with a conductor material;
    removing at least some of the blocking layer to expose the first group;
    filling the first group with a heater material;
    forming phase change section on at least one of the first group, wherein the phase change section comprises a phase change material; and forming an electrode on the phase change section.

12. The method of claim 11, further comprising forming a nitride cap over the second group after the filling the second group with the conductor material.

13. The method of claim 12, further comprising performing chemical mechanical planarization (CMP) after the filling the first group with a heater material to planarize the heater material and the conductor material in the first group and the second group, respectively.

14. The method of claim 11, wherein the phase change section and the electrode extend over two adjacent trenches in the first group.

15. The method of claim 11, wherein:
the at least one of the first group has a first width;
the phase change section has a second width; and
the second width is greater than or equal to twice the first width to form a mushroom-type phase change cell.

16. The method of claim 11, wherein the fill material comprises an oxide material.

17. The method of claim 11, further comprising forming a via that is electrically connected to the electrode.

18. The method of claim 11, further comprising removing the fill material from the first group before the filling the first group with the heater material.

19. An integrated circuit comprising:
a substrate; and
a plurality of levels stacked on the substrate, wherein:
a trench silicide (TS) level is a level in direct contact with the substrate;
a contact (CA/CB) level is a level in direct contact with the TS level;
a metal level is a level in direct contact with the CA/CB level; and
a phase change memory (PCM) cell is positioned in the TS and CA/CB levels.

* * * * *